United States Patent
Tschirky et al.

(10) Patent No.: US 6,969,993 B2
(45) Date of Patent: Nov. 29, 2005

(54) NMR SPECTROMETER WITH GRIPPING DEVICE FOR HANDLING A SAMPLE BUSHING WITH OUTER GROOVE

(75) Inventors: Hansjörg Tschirky, Ettingen (CH); Remo Hochstrasser, Oberwil (CH); Michael Fey, Hornussen (CH); Kurt Himmelsbach, Fehraltorf (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 10/689,660

(22) Filed: Oct. 22, 2003

(65) Prior Publication Data

US 2005/0062474 A1 Mar. 24, 2005

(30) Foreign Application Priority Data

Sep. 19, 2003 (DE) .................................. 203 14 517 U

(51) Int. Cl.[7] .................................................. G01V 3/00
(52) U.S. Cl. ....................................... 324/321; 324/318
(58) Field of Search ................................ 324/318–322, 324/306; 73/864.21

(56) References Cited

U.S. PATENT DOCUMENTS

| | | | | |
|---|---|---|---|---|
| 4,581,583 A | * | 4/1986 | Van Vliet et al. ............ 324/321 |
| 4,859,949 A | * | 8/1989 | McKenna .................... 324/321 |
| 5,517,856 A | * | 5/1996 | Hofmann et al. ........... 324/321 |
| 6,362,624 B1 | * | 3/2002 | Wand et al. ................. 324/321 |
| 6,563,317 B2 | * | 5/2003 | Warden et al. .............. 324/318 |
| 6,686,740 B2 | * | 2/2004 | Tschirky et al. ............ 324/321 |
| 6,741,079 B2 | * | 5/2004 | Hofmann et al. ........... 324/321 |
| 6,812,706 B2 | * | 11/2004 | Leung et al. ................ 324/321 |
| 2002/0135372 A1 | * | 9/2002 | Warden et al. .............. 324/321 |
| 2002/0196022 A1 | * | 12/2002 | Tschirky et al. ............ 324/321 |
| 2002/0196023 A1 | * | 12/2002 | Hofmann et al. ........... 324/321 |
| 2003/0209091 A1 | * | 11/2003 | Fattinger et al. ......... 73/864.21 |
| 2005/0062474 A1 | * | 3/2005 | Tschirky et al. ............ 324/321 |

OTHER PUBLICATIONS

Bruker's 1mm MicroProbes 400–600MHz Catalog of Applications, Bruker BioSpin, Sales Broshure, Mar. 2003.

* cited by examiner

*Primary Examiner*—Brij Shrivastav
*Assistant Examiner*—Tiffany A. Fetzner
(74) *Attorney, Agent, or Firm*—Paul Vincent

(57) ABSTRACT

A nuclear magnetic resonance (NMR) spectrometer for investigating a liquid sample in a sample tube, in particular a glass sample tube (12), has a sample bushing (1) surrounding the sample tube having a bore into which one end of the sample tube is inserted with tight fit. The sample bushing (1) is preferably substantially cylindrical and the bore extends along the cylindrical axis. The NMR spectrometer has a gripping device (13) for handling the sample bushing (1), the gripping device (13) having at least three gripping fingers (14a–14d), and the outer periphery of the sample bushing (1) has at least one groove (2) into which the gripping fingers (14a–14d) can engage to press onto the two outer edges of the groove (2) when the gripping device (13) is closed. The cooperation between the groove and the gripping device permits fully automated, precise handling of the samples.

20 Claims, 4 Drawing Sheets

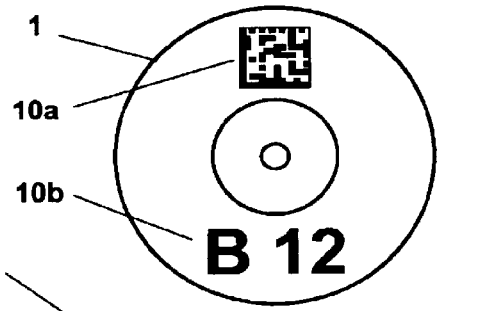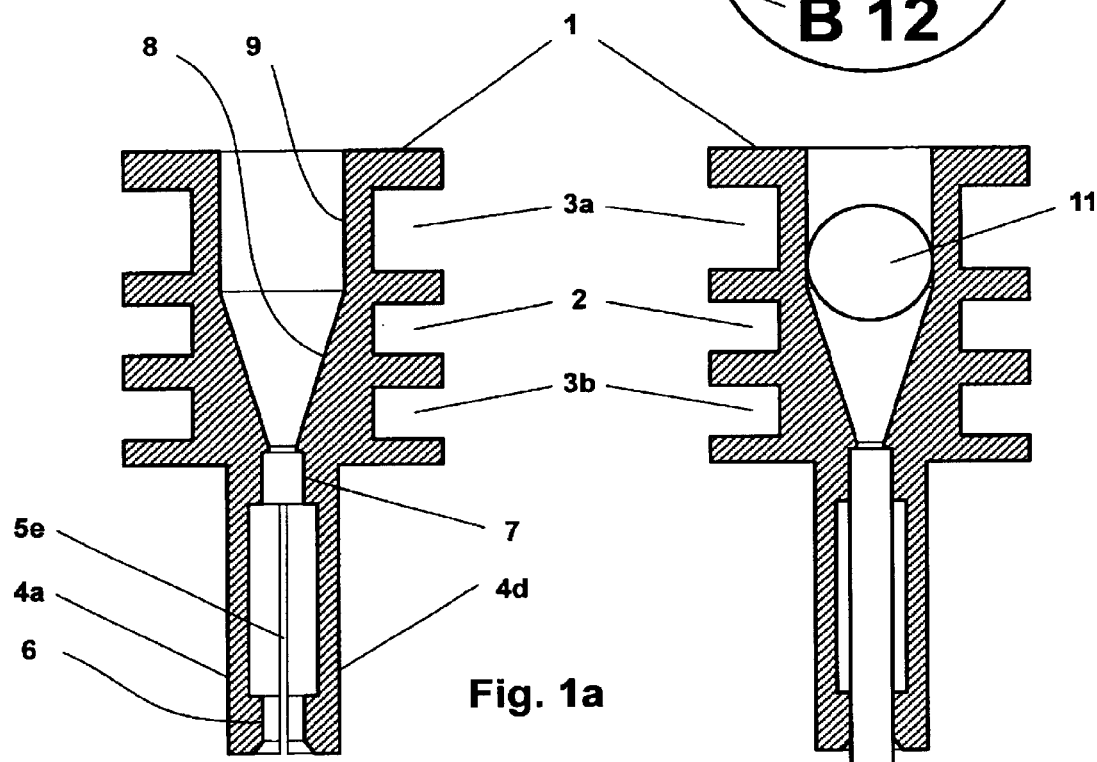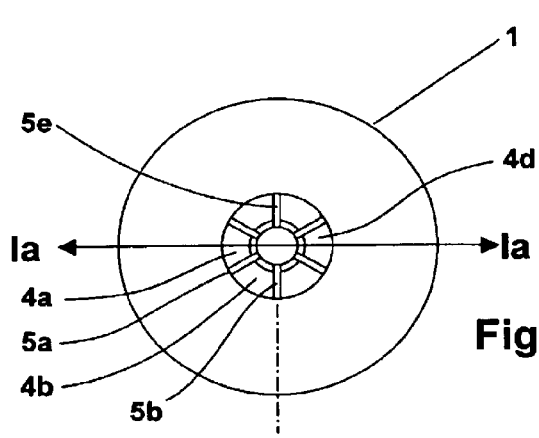

NMR SPECTROMETER WITH GRIPPING DEVICE FOR HANDLING A SAMPLE BUSHING WITH OUTER GROOVE

This application claims Paris Convention priority of DE 203 14 517.8 filed Sep. 19, 2003 the complete disclosure of which is hereby incorporated by reference.

BACKGROUND OF THE INVENTION

The invention concerns a nuclear magnetic resonance (NMR) spectrometer for investigating a liquid sample in a sample tube, in particular a glass sample tube, with a sample bushing having a bore into which one end of the sample tube is inserted with tight fit, wherein, in particular, the sample bushing is substantially cylindrical and the bore extends along the cylinder axis and wherein the sample bushing has at least one groove on its outer periphery.

An NMR spectrometer of this type is disclosed e.g. in the leaflet "Bruker's 1 mm MicroProbes, 400–600 MHz, Catalogue of Applications" of the company group Bruker BioSpin.

Nuclear magnetic resonance (NMR) spectroscopy is an effective method to analyze the structure of chemical compounds.

Since the available amount of sample is often very small, this sample amount is filled into measuring capillaries with an outer diameter of typically approximately 1 mm, which also saves space for storing the measuring samples.

Handling of microsamples is difficult due to the fragility of the measuring capillaries. For handling, the sample must be transported for NMR measurement to the region of high magnetic field, typically to the inside of a superconducting magnet coil, wherein high positioning accuracy is required.

There are conventional sample bushings (Bruker's 1 mm MicroProbes, 400–600 MHz, Catalogue of Applications) to prevent direct handling of the measuring capillaries. These measuring capillaries—or more generally a sample tube—is held in the sample bushing and only the sample bushing is directly handled during transport. The sample bushing is made from a sufficiently robust material, e.g. plastic material.

The sample bushing is handled manually using suitable tools, e.g. tweezers, to position the sample bushing, e.g. to introduce the sample bushing including sample tube from a container into a rotor or vice versa. This process requires great operator skill and is therefore very risky for the sample.

The sample glass is usually introduced into the measuring chamber of the NMR magnet by means of an air cushion, wherein this dynamic process is very critical and the sample glass can easily break, in particular when the sample bushing is heavy and therefore exerts large inertial forces onto the sample glass. For this reason, the sample bushing is conventionally provided with one or more grooves to reduce material and weight.

It is the underlying purpose of the present invention to present an NMR spectrometer which permits safe handling of a sample bushing including sample tube.

SUMMARY OF THE INVENTION

This object is achieved in accordance with the invention in that the NMR spectrometer comprises a gripping device for handling the sample bushing, the gripping device having at least three gripping fingers, and the outer periphery of the sample bushing has at least one groove into which the gripping fingers can engage and press onto the two outer edges of the groove when the gripping device is closed.

The inventive cooperation between the groove of the sample bushing and the gripping device permits fully automatic gripping of the sample bushing, wherein maximum control with regard to vertical positioning and horizontal positioning of the sample is obtained. This is possible through a total of at least six contacting points between the gripping device and the sample bushing. Two contact points per gripping finger prevent play of the sample bushing in the direction from one outer edge of the groove to an opposite outer edge of the groove and the at least three gripping fingers, which are preferably uniformly distributed about the periphery of the sample bushing, prevent play along the planes containing the outer edges of the groove. The at least three gripping fingers additionally permit effective centering of the sample bushing, e.g. for introduction into a bore.

One embodiment is particularly preferred with which the gripping device comprises four gripping fingers. This embodiment can cooperate particularly well with a sample bushing container, wherein the sample bushings (including sample glasses) are disposed in a flat square grid. The square grid may be relatively narrow without limiting the gripping motion of the gripping fingers by the sample bushings.

One embodiment of the inventive NMR spectrometer is also particularly preferred with which the gripping fingers each comprise a conical or rounded projection, which is oriented radially inwardly towards the symmetrical axis of the sample bushing, for abutment on the two outer edges of the groove. A conical or rounded projection is suitable for engagement in grooves of different widths and always produces sharp contact regions which permit unique guiding control of the sample bushing.

Another preferred embodiment provides that the sample bushing comprises a conical bore for introducing the injection needle of a filling device. The conical bore serves as guide and facilitates filling of sample liquid into a sample glass.

To connect the sample glass with the sample bushing in a gas-tight manner, a preferred embodiment comprises a cylindrical force fit with very precise inner dimensions into which the sample glass is inserted. This force fit must not be too tight since the sample glass could break. On the other hand, it should not be too loose to guarantee gas-tight connection.

In one embodiment, the sample bushing can advantageously be closed with a closing ball, in particular in a gas-tight manner to prevent deterioration or destabilization of the sample through evaporation processes or oxidation.

One embodiment is also preferred, with which the outer diameter of the sample tube is less than 2 mm, in particular approximately 1 mm. For such mechanically sensitive sample tubes or glasses, the inventive automated and controlled handling is particularly advantageous.

In one further preferred embodiment of the inventive NMR spectrometer, the sample bushing has a coding, in particular a data matrix with data for identifying the sample. Recording of test proceedings and unique association with a given sample are facilitated. The data matrix may be printed on or burnt-on by a laser. The coding may be a machine-readable bar code.

A readable alphanumerical marking of the sample bushing is preferred for identification of the container and the position within this container where the sample glass is to be processed.

In one preferred embodiment, the at least one groove has a polygonal, preferably rectangular or triangular cross-section. Grooves of this type are easy to produce and typically have sharp outer edges, i.e. transitions to the non-recessed region of the sample bushing on the outer shell. The sharp outer edges reduce play of the sample bushing in the gripping device in the closed (holding) state.

One embodiment of the inventive NMR spectrometer is particularly preferred, with which the at least one groove is formed as a continuous centering groove which extends around the entire periphery of the sample bushing. In this case, the sample bushing or the gripping fingers must not be oriented (rotated) before gripping the sample bushing since the groove can be gripped equally conveniently in any rotary position of the approximately cylindrical envelope of the sample bushing.

In an advantageous embodiment, the sample bushing has several grooves, in particular several grooves extending around the entire periphery of the sample bushing. The additional grooves may be structured for handling with different gripping devices, for gripping the sample bushings at different levels, or to reduce weight.

In a preferred embodiment of the inventive NMR spectrometer, the sample bushing has an outer diameter of 10 mm or less, in particular 3 to 8 mm. This range of outer diameters is sufficiently small to obtain low weight (inertial forces) while being sufficiently large to ensure easy manufacturing.

The present invention also comprises a sample bushing of an inventive NMR spectrometer which is characterized in that a groove is formed on the outer periphery of the sample bushing such that the gripping fingers of the gripping device can engage in the groove at at least three locations distributed radially around the periphery of the sample bushing for handling the sample bushing and press on the two outer edges of the groove when the gripping device is closed. The inventive contact between groove and gripping fingers permits simple, safe and automated handling of the sample bushing.

Further advantages can be extracted from the description and the drawing. The features mentioned above and below can be used in accordance with the invention individually and collectively in arbitrary combination. The embodiments shown and described are not to be understood as exhaustive enumeration, rather have exemplary character for describing the invention.

The invention is shown in the drawing and explained in more detail with reference to embodiments.

BRIEF DESCRIPTION OF THE DRAWING

FIG. 1a shows a schematic cross-section through an inventive sample bushing along its longitudinal axis;

FIG. 1b shows a top view onto the lower end of the inventive sample bushing of FIG. 1a;

FIG. 2a shows a schematic cross-section through an inventive sample bushing along its longitudinal axis with a sample glass disposed therein;

FIG. 2b shows a top view onto the sample bushing of FIG. 2a;

DESCRIPTION OF THE PREFERRED EMBODIMENT

Figures 3, 3A:
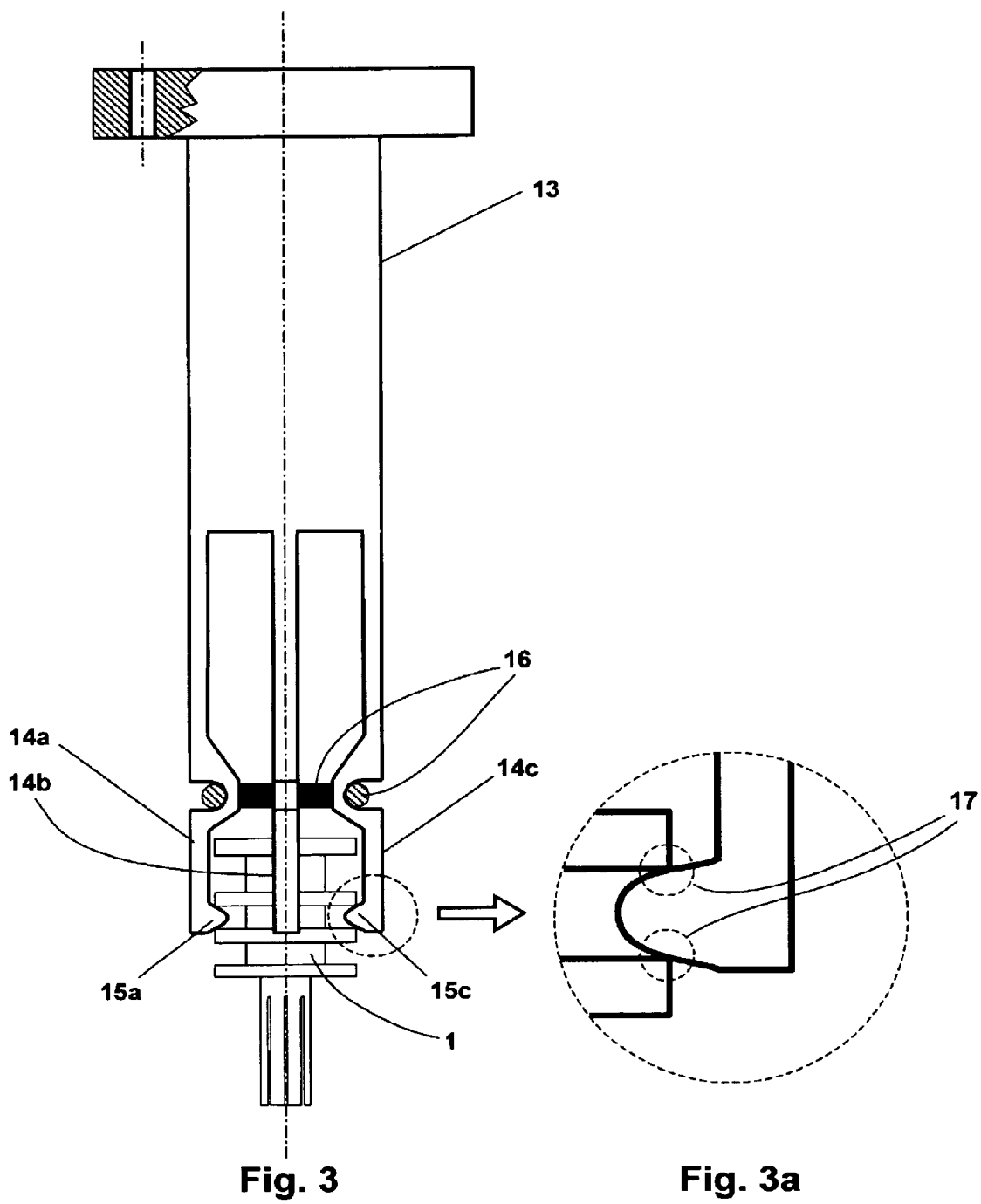
FIG. 3 shows a schematic cross-section through part of an inventive NMR spectrometer with a gripping device and a sample bushing.
FIG. 3a shows a detailed section of FIG. 3 in the region of a rounded projection of a gripping finger.

FIG. 1a shows a section through an inventive sample bushing 1 along the section plane Ia—Ia of FIG. 1b. FIG. 1b shows the view from below and also indicates the section plane Ia—Ia of FIG. 1a.

The roughly cylindrical sample bushing 1 has several continuous grooves 2, 3a, 3b in its upper region, with the central groove 2 being suitable for engagement by gripping fingers. The grooves 3a and 3b are provided to reduce the weight of the sample bushing 1. At least three, e.g. six centering elastic spring arms 4a–4f are formed in the lower region of the sample bushing 1, which also center the sample glass to be held. The spring arms 4a–4f are separated from each other by six slots 5a–5f. The lower ends of the spring arms 4a–4f have inner surfaces 6 which directly abut on the sample glass.

The sample bushing 1 has an approximately central cylindrical recess which constitutes a gas-tight (i.e. also liquid-tight) press fit 7 for the sample glass. A cylindrical access opening 9 and a conical bore 8 permit introduction of an injection needle into a held sample glass for filling.

FIG. 2a also shows a cross-section along the plane Ia—Ia of FIG. 1b of the inventive sample bushing 1, but with a sample glass 12 which is clamped in the sample bushing 1 and consists of a tubular glass capillary which is closed at the bottom.

A closing ball 11 is disposed in the region of the upper access opening and the conical bore which permits gas-tight (i.e. also liquid-tight) closure of the sample bushing 1 such that no air can penetrate into the sample glass 12 and no sample components can evaporate to the outside.

FIG. 2b shows a top view onto the inventive sample bushing 1. The disk-shaped upper edge has a data matrix 10a and an alphanumerical marking 10b ("B12") for identification of the sample or storage position of the sample in an associated container (or storing system). The data matrix contains information about the sample substance, i.e. origin, composition, dangerous substances, experiment designation and the like.

FIG. 3 is a sectional view of a gripping device 13 of the invention which holds a sample bushing 1 in the closed state (see previous figures). The gripping fingers 14–14d and upper cylindrical main part of the gripping device 13 are produced from one single solid body to obtain the required accuracy for mechanical processing. Towards this end, e.g. rotating and milling processes are used.

The gripping fingers 14a–14d engage with rounded projections 15a–15d in the central groove of the sample bushing 1. The gripping fingers 14a–14d thereby press from the outside with a radially inward force on the radially outer edges of the central groove. The rounded projections 15a–15d abut on the groove at the contact points 17 (see sectional enlargement of FIG. 3a). The radially inward force is provided by the elasticity of the gripping fingers 14a–14d and by an elastic O-ring or spring ring 16, which attempts to contract.

Figure 4:
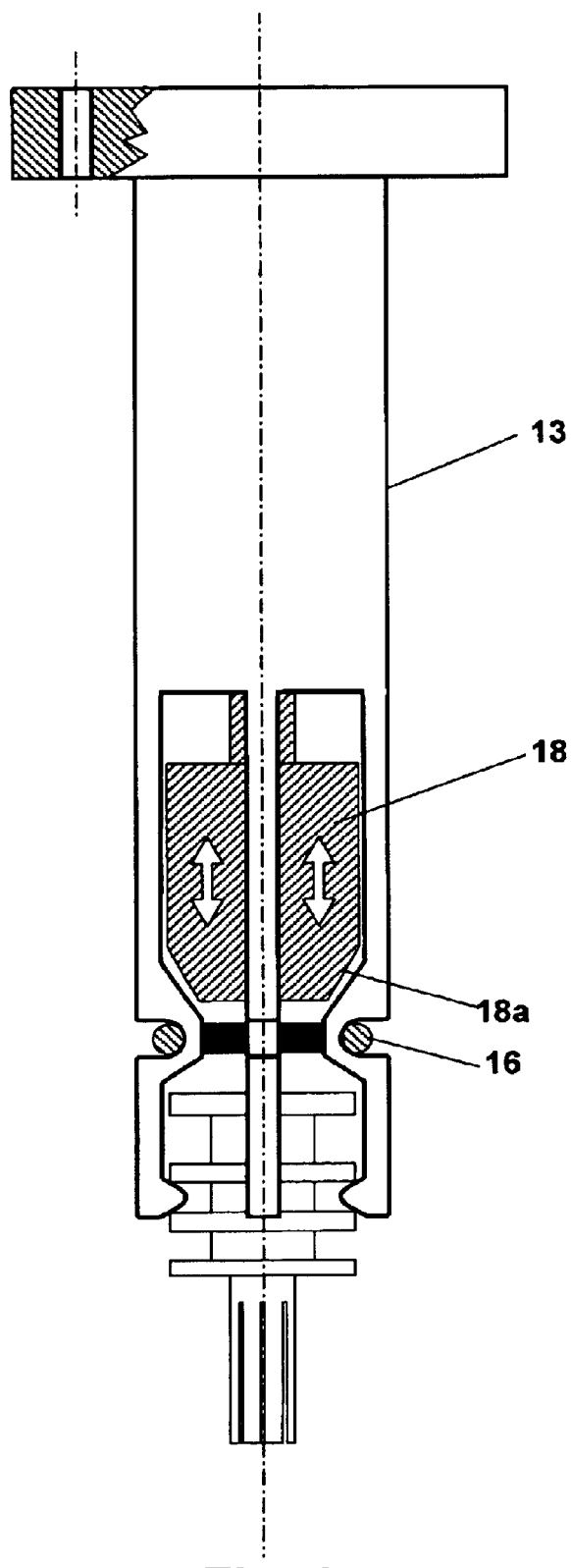
FIG. 4 shows a schematic cross-section through part of an inventive NMR spectrometer according to FIG. 3 with an expanding cone.

FIG. 4 shows a similar cross-section as FIG. 3 and explains the opening mechanism of the gripping device 13. An expanding cone 18 is disposed in a partially conical recess inside of the gripping device 13. The expanding cone 18 can be moved upwardly and downwardly. A downward motion of the expanding cone 18 causes abutment of a front surface 18a of the expanding cone on the conical part of the recess inside of the gripping device 13 and the lower part of the gripping device is spread (expanded), in particular in the region of the gripping fingers. The rounded projections of the gripping fingers thereby slide out of the central groove of the sample bushing and the sample bushing is released.

If, conversely, the expanding cone 18 is moved upwards, the elasticity of the gripping fingers and the O-ring or spring ring 16 result in inward loading of the gripping fingers to clamp the sample bushing.

Figure 5:
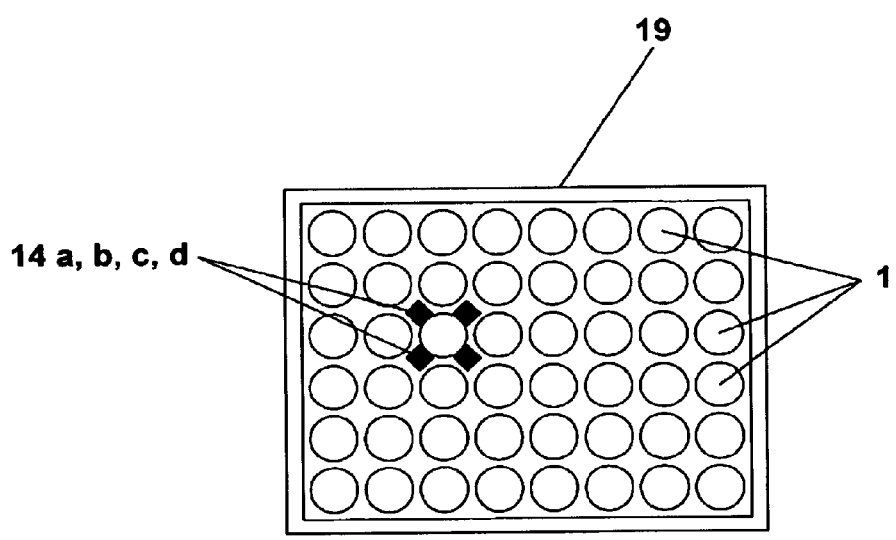
FIG. 5 shows a schematic view onto a container for sample bushings and the four gripping fingers of a gripping device which handle one of the sample bushings.

FIG. 5 shows a container 19 for storing and transporting several sample bushings 1. The fourfold symmetrical geometrical shape of the gripping fingers 14a–14d corresponds to the geometrical shape of the fourfold symmetrical gaps between the sample bushings 1 disposed in rows and columns. The sample bushings 1 are each disposed in suitable recesses or bores in a holding plate of the container 19. The surface density of the sample bushings 1 is selected such that the gaps (space) between the sample bushings 1 is just sufficient to be able to lower the gripping fingers 14a–14d into the gaps. The adjusted geometrical shape of the gripping fingers 14a–14d and the storage locations in the container 19 permits storing of the sample bushings 1 in tight abutment.

The container 19 is preferably disposed in a defined manner relative to the gripping device to facilitate automatic handling of the sample bushings 1.

LIST OF REFERENCE NUMERALS

1 The inventive sample bushing produced from one piece

2 Groove into which the gripping fingers 14a,b,c,d are to grip 3a,b Grooves for reducing the overall weight of the sample bushing 4a,b,c,d,e,f Resilient centering arms of the sample bushing 1 which are also responsible for axial and radial centering of the sample glass 12 relative to the sample bushing 5a,b,c,d,e,f Slots for obtaining resilient effect of the centering arms 4a,b,c,d,e,f 6 Inner surfaces of the centering arms 4a,b,c,d,e,f which press onto the sample glass and thereby exert a centering effect on the sample glass 7 Cylindrical press fit for holding the sample glass within the sample bushing thereby obtaining gas-tight closure between sample bushing and sample glass 8 Conical section of the sample bushing which permits easy introduction of the injection needle of a filling device into a sample glass 9 Cylindrical access opening of the sample bushing which provides gas-tight closure of the sample glass by means of the closing ball 11

10a,b Data matrix and alphanumerical marking of the sample bushing. It is printed or burnt onto the sample bushing using laser radiation 10a Data matrix which contains all relevant sample data 10b Marking to identify the container and the position within this container where the sample glass is to be processed 11 Closing ball which is pressed into the access opening 9 of the sample bushing for closing the sample glass in a gas-tight fashion 12 Sample glass which contains the substance to be measured 13 Gripping device for transporting the sample bushing including sample glass to the desired location. To obtain the required mechanical accuracy, this gripping device is produced from one single piece through turning, milling and drilling processes 14a,b,c,d Gripping fingers for holding and transporting the sample bushing including sample glass 15a,b,c,d Rounded projections which engage in the groove 2 and permit centering of the sample bushing relative to the gripping device 16 O-ring or spring ring which radially inwardly compresses the gripping fingers by its resilient effect 17 The two contacting points between the rounded projection 15c and the outer edges of the groove 2

18 Expanding cone inside the gripping device 13 which can be moved upwards and downwards. It has a conical surface 18a on the front end for spreading the gripping fingers 14a,b,c,d outwardly thereby releasing the gripping bushing 1

18a Front conical surface of the expanding cone

19 Container for keeping and storing the sample bushings including sample glass

We claim:

1. A nuclear magnetic resonance (NMR) spectrometer for investigating a liquid sample in a sample tube, the NMR spectrometer comprising:

a sample bushing surrounding the sample tube, said sample bushing having a bore into which one end of the sample tube is inserted with close tolerance, said sample bushing being substantially cylindrical with said bore extending along a cylinder axis thereof, said sample bushing having at least one groove fashioned externally on an outer surface of said sample bushing; and a gripping device in cooperation with said sample bushing, said gripping device having at least three gripping fingers which engage said at least one groove of said sample bushing by pressing onto two outer edges of said groove in a closed configuration of said gripping device.

2. The NMR spectrometer of claim 1, wherein said gripping device comprises four gripping fingers.

3. The NMR spectrometer of claim 1, wherein each of said gripping fingers has a conical or rounded projection which is oriented radially inwardly towards said cylinder axis of said sample bushing in abutment with said two outer edges of said groove.

4. The NMR spectrometer of claim 1, further comprising an expanding cone disposed inside said gripping device enabling upward and downward motion therein, said cone having a conical surface at a lower end thereof that accommodates spreading of said gripping fingers.

5. The NMR spectrometer of claim 1, wherein said sample bushing defines a press fit into which the sample glass is insertable in a gas-tight manner.

6. The NMR spectrometer of claim 1, wherein said sample bushing has a conical bore permitting introduction of an injection needle of a filling device.

7. The NMR spectrometer of claim 1, further comprising a closing ball that seals said sample bushing in a liquid or gas-tight fashion.

8. The NMR spectrometer of claim 1, wherein an outer diameter of the sample tube is less than 2 mm.

9. The NMR spectrometer of claim 8, wherein an outer diameter of the sample tube is less than 1 mm.

10. The NMR spectrometer of claim 1, wherein said sample bushing has an identification coding.

11. The NMR spectrometer of claim 10, wherein said identification coding is a data matrix with data identifying the sample.

12. The NMR spectrometer of claim 1, wherein said sample bushing has an alphanumerical marking, which can be visually read in determining a position where the sample glass is processed.

13. The NMR spectrometer of claim 12, further comprising a container within which the sample is positioned by utilizing said marking.

14. The NMR spectrometer of claim 1, wherein said at least one groove has a polygonal, rectangular or triangular cross-section.

15. The NMR spectrometer of claim 1, wherein said at least one groove is formed as a continuous unbroken centering groove which extends around an entire periphery of said sample bushing.

16. The NMR spectrometer of claim 1, wherein said sample bushing has several grooves.

17. The NMR spectrometer of claim 16, wherein each one of said several grooves extends around an entire periphery of said sample bushing.

18. The NMR spectrometer of claim 1, wherein said sample bushing has an outer diameter of 10 mm or less.

19. The NMR spectrometer of claim 18, wherein said outer diameter is 3 mm to 8 mm.

20. The sample bushing of the NMR spectrometer of claim 1, wherein said groove is formed such that said gripping fingers of said gripping device engage at least three groove locations distributed radially around said outer surface of said sample bushing, retaining said sample bushing while pressing onto said two outer edges of said groove when said gripping device is closed.

* * * * *